United States Patent
Iwai

(10) Patent No.: US 8,120,234 B2
(45) Date of Patent: Feb. 21, 2012

(54) PIEZOELECTRIC FRAMES AND PIEZOELECTRIC DEVICES COMPRISING SAME

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 241 days.

(21) Appl. No.: 12/655,154

(22) Filed: Dec. 22, 2009

(65) Prior Publication Data

US 2010/0156246 A1 Jun. 24, 2010

(30) Foreign Application Priority Data

Dec. 22, 2008 (JP) ................................. 2008-324889

(51) Int. Cl.
*H03H 9/21* (2006.01)
*H01L 41/053* (2006.01)
(52) U.S. Cl. ......................................... 310/370; 310/348
(58) Field of Classification Search .................. 310/348, 310/370
See application file for complete search history.

(56) References Cited

U.S. PATENT DOCUMENTS

| | | | | |
|---|---|---|---|---|
| 2001/0017505 A1* | 8/2001 | Aratake et al. | ................. | 310/340 |
| 2010/0079036 A1* | 4/2010 | Iwai | ............................... | 310/348 |
| 2010/0079040 A1* | 4/2010 | Iwai et al. | ..................... | 310/370 |
| 2010/0148634 A1* | 6/2010 | Ichikawa | ....................... | 310/348 |
| 2010/0164328 A1* | 7/2010 | Iwai | ............................... | 310/348 |

FOREIGN PATENT DOCUMENTS

| | | |
|---|---|---|
| JP | 2004-208237 | 7/2004 |
| JP | 2007-013910 | 1/2007 |
| JP | 2007-202211 | 8/2007 |
| JP | 2007-258918 | 10/2007 |
| JP | 2008-177723 | 7/2008 |

OTHER PUBLICATIONS

Office Action for related Japanese Patent Application No. 2008-324889, 4 pages, date unknown.

* cited by examiner

*Primary Examiner* — Thomas M Dougherty
(74) *Attorney, Agent, or Firm* — Klarquist Sparkman, LLP

(57) ABSTRACT

Piezoelectric frames are disclosed that include a tuning-fork type piezoelectric vibrating portion having a pair of vibrating arms extending from a base portion in a first direction (Y-direction). The vibrating arms have a first width W1. A respective excitation electrode is formed on each vibrating arm. Supporting arms extend from the base portion in the first direction, outboard of respective vibrating arms. The supporting arms have a second width W2. A respective connecting arm extends from each supporting arm in a second direction that crosses the first direction. An outer frame connects to the connecting arms, has a side extending in the first direction with a third width W3, and has another side extending in the second direction with a fourth width W4. The second width W2 is 1.4 times smaller than the first width W1.

20 Claims, 8 Drawing Sheets

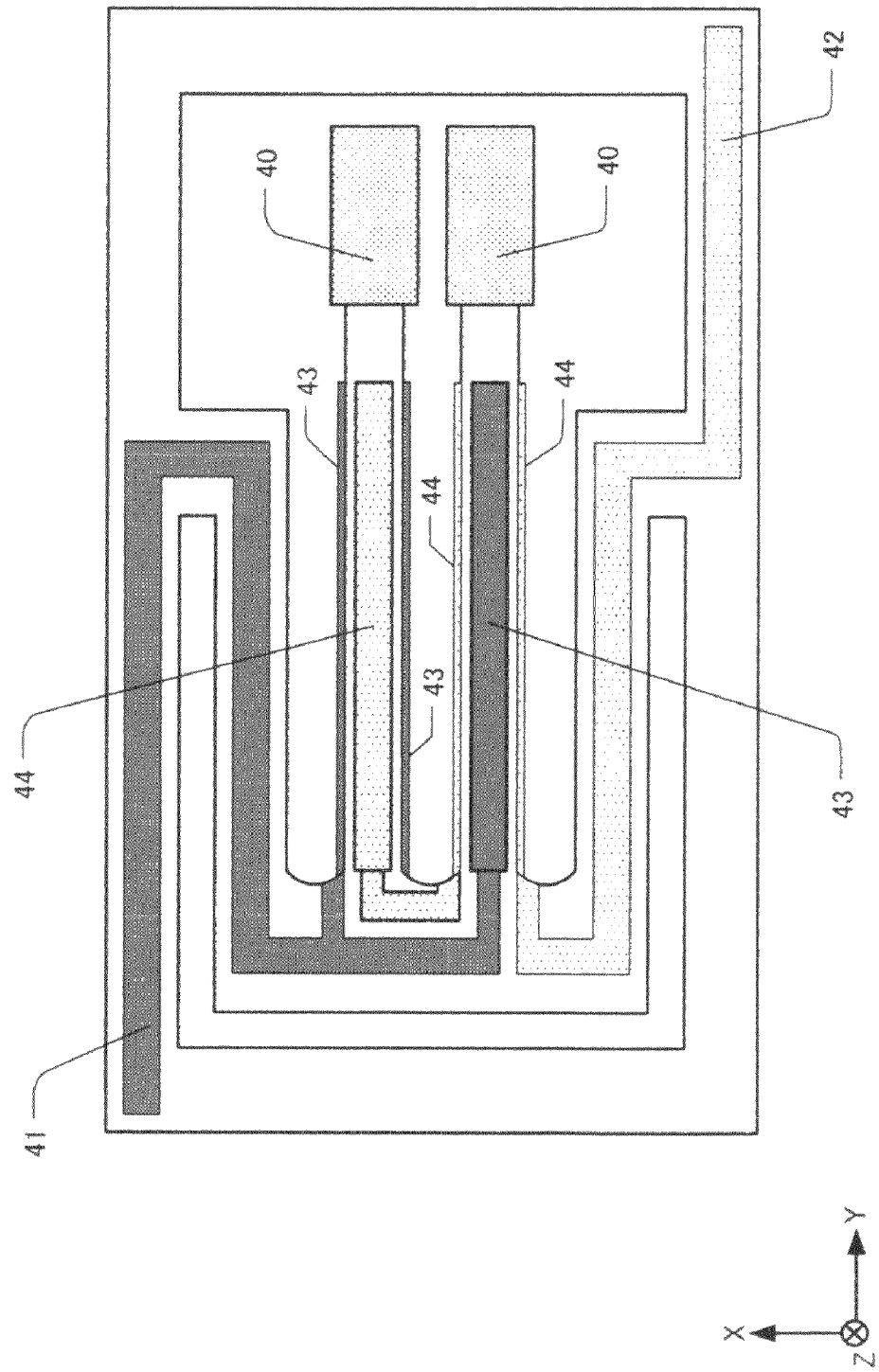

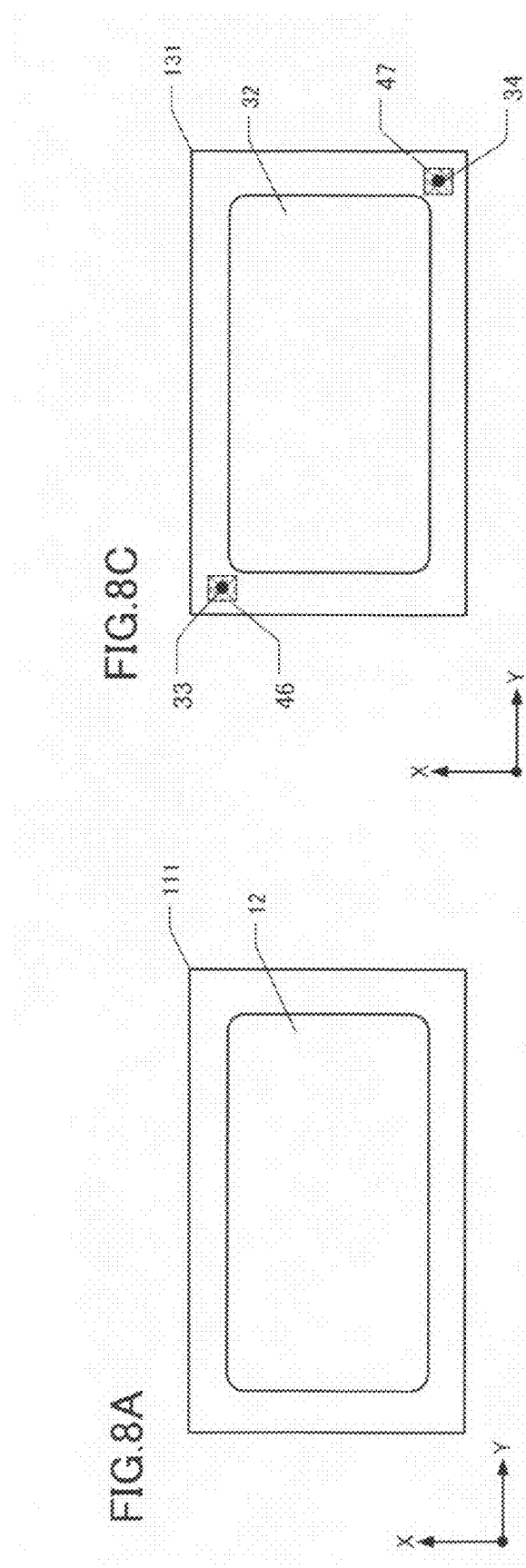
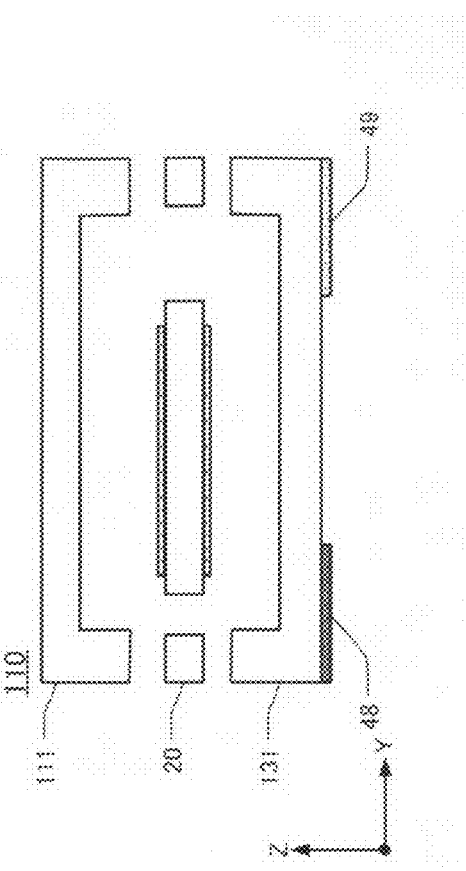

PIEZOELECTRIC FRAMES AND PIEZOELECTRIC DEVICES COMPRISING SAME

CROSS-REFERENCE TO RELATED APPLICATION

This application claims priority to and the benefit of Japan Patent Application No. 2008-324889, filed on Dec. 22, 2008, in the Japan Patent Office, the disclosure of which is incorporated herein by reference in its entirety.

FIELD

This disclosure pertains to, inter alia, methods for manufacturing tuning-fork type piezoelectric frames including vibrating arms, supporting arms, and other structures made of a piezoelectric material such as quartz crystal.

DESCRIPTION OF THE RELATED ART

With the progress of miniaturization and/or increases in the operating frequency of mobile communications apparatus and office automation (OA) equipment, piezoelectric oscillators or vibrators used in this equipment must be progressively smaller and/or operate at higher frequency. Also required are piezoelectric oscillators that can be surface-mounted (SMD: Surface-Mounted Device) on circuit boards and the like.

Piezoelectric oscillators (or piezoelectric vibrators or piezoelectric devices) comprise a crystal frame surrounding a piezoelectric vibrating element (also termed a "tuning-fork type piezoelectric vibrating element" or "tuning-fork type piezoelectric vibrating piece"). The tuning-fork type piezoelectric vibrating element comprises a base portion and vibrating portion. The vibrating portion comprises tuning-fork type vibrating arms that extend integrally from the base portion. For making a thin SMD, the frame portion (also termed a "crystal frame") and vibrating element desirably have configurations allowing miniaturization in one or more of the X, Y, and Z-direction.

A conventional technique for forming a tuning-fork type piezoelectric vibrating piece and integral frame portion is disclosed in Japan Unexamined Patent Application No. 2004-208237. The piezoelectric vibrating piece and frame portion are formed integrally as a "crystal frame." The crystal frame comprises connecting portions that extend from a base portion to the frame portion to connect the piezoelectric vibrating piece to the frame portion. The vibrating portion extends from the base portion. Specifically, the vibrating portion includes a pair of vibrating arms that extend from the base portion in the Y-direction. One or more connecting portions extend in the X-direction to the frame portion, while other connecting portion(s) extend in the Y-direction to the frame portion. The connecting portions are formed integrally with the frame portion, base portion, and vibrating portion. The crystal frame is integrated into a package by bonding thereto an upper package portion and a lower package portion. In the resulting package, the base portion being connected to the frame portion by at least three connecting portions is resistant to adverse effects of external physical impacts and shocks.

However, as piezoelectric devices have become increasingly miniaturized, vibrating portions having at least three integral connecting portions tend increasingly to exhibit frequency variability as a consequence of their being packaged or mounted as an SMD on a circuit board using solder.

In view of the above, an object of invention is to provide a crystal frame, with attached piezoelectric vibrating piece, that exhibits less frequency variability after being sealed in a package or surface-mounted on a substrate.

SUMMARY

The needs articulated above are met by various aspects of the invention. According to a first aspect, piezoelectric frames are provided that comprise a tuning-fork type piezoelectric vibrating portion. In one embodiment, the vibrating portion includes a base portion, a pair of vibrating arms extending in a first direction (e.g., Y-direction) from the base portion, and an excitation electrode formed on the vibrating arms. Each vibrating arm has a first width (e.g., in the X-direction) denoted "W1." Outboard of each vibrating arm is a respective supporting arm that extends from the base portion in the first direction. Each supporting arm has a second width (e.g., in the X-direction) denoted "W2." A respective connecting arm extends from each supporting arm in a second direction (e.g., X-direction) that crosses (e.g., is perpendicular to) the first direction. An outer frame portion connects to the connecting arms and surrounds the tuning-fork type piezoelectric vibrating piece, supporting arms, and connecting arms. The outer frame portion includes first side members extending parallel to each other in the first direction and second side members extending parallel to each other in the second direction. The first and second side members are coupled together to form the outer frame portion. The first side members have a third width (e.g., in the X-direction) denoted "W3," and the second side members have a fourth width (e.g., in the Y-direction) denoted "W4," wherein $W2 \leq (1.4 \times W1)$. By thus specifying W2, the rate of frequency change ($\Delta f/f$) exhibited by the vibrating portion is reduced while obtaining stable oscillations. Desirably, the third width is 1.1 times the first width or greater: $W3 \geq (1.1 \times W1)$.

Another embodiment of a piezoelectric frame comprises the structural features of the first embodiment summarized above. But, instead of W2 being specified as in the first embodiment, $W3 \geq (1.1 \times W4)$. In this second embodiment, desirably $W4 \geq W1$. By thus specifying W3, $\Delta f/f$ is reduced while obtaining stable oscillations. By additionally specifying $W4 \geq W1$, packaging and sealing of the crystal frame is facilitated.

According to another aspect, piezoelectric devices are provided that comprise a piezoelectric frame within the scope of the foregoing summary, a lid covering the piezoelectric frame, and a package base supporting the piezoelectric frame. In one embodiment the lid and package base are made of a material comprising glass containing metal ions. In this embodiment the first side members and second side members each comprise a surficial metal film on respective surfaces thereof facing the lid and package base, and the lid and package base are bonded to the metal films as a result of anodic bonding.

In another embodiment the lid and base are each made of a piezoelectric material, wherein the outer frame portion is bonded to the lid and to the package base as a result of siloxane bonding.

The piezoelectric devices within the scope of the foregoing summary exhibit reduced values of $\Delta f/f$ and stable oscillations. Also, the various embodiments of crystal frames and piezoelectric devices exhibit less $\Delta f/f$ upon sealing in a package or mounting on a substrate, and exhibit more stable vibrations than otherwise similar conventional frames and devices.

BRIEF DESCRIPTION OF THE DRAWINGS

FIG. 6 is a plan view of an embodiment of a crystal frame, including electrode configurations.

FIG. 8A is a plan view of the inner major surface of a package lid of the second embodiment of a piezoelectric device.

FIG. 8B is a plan view of the crystal frame of the second embodiment of a piezoelectric device.

FIG. 8C is a plan view of the inner major surface of a package base of the second embodiment of a piezoelectric device.

FIG. 8D is an elevational section of the second embodiment of a piezoelectric device.

DETAILED DESCRIPTION

First Embodiment

Figure 1:
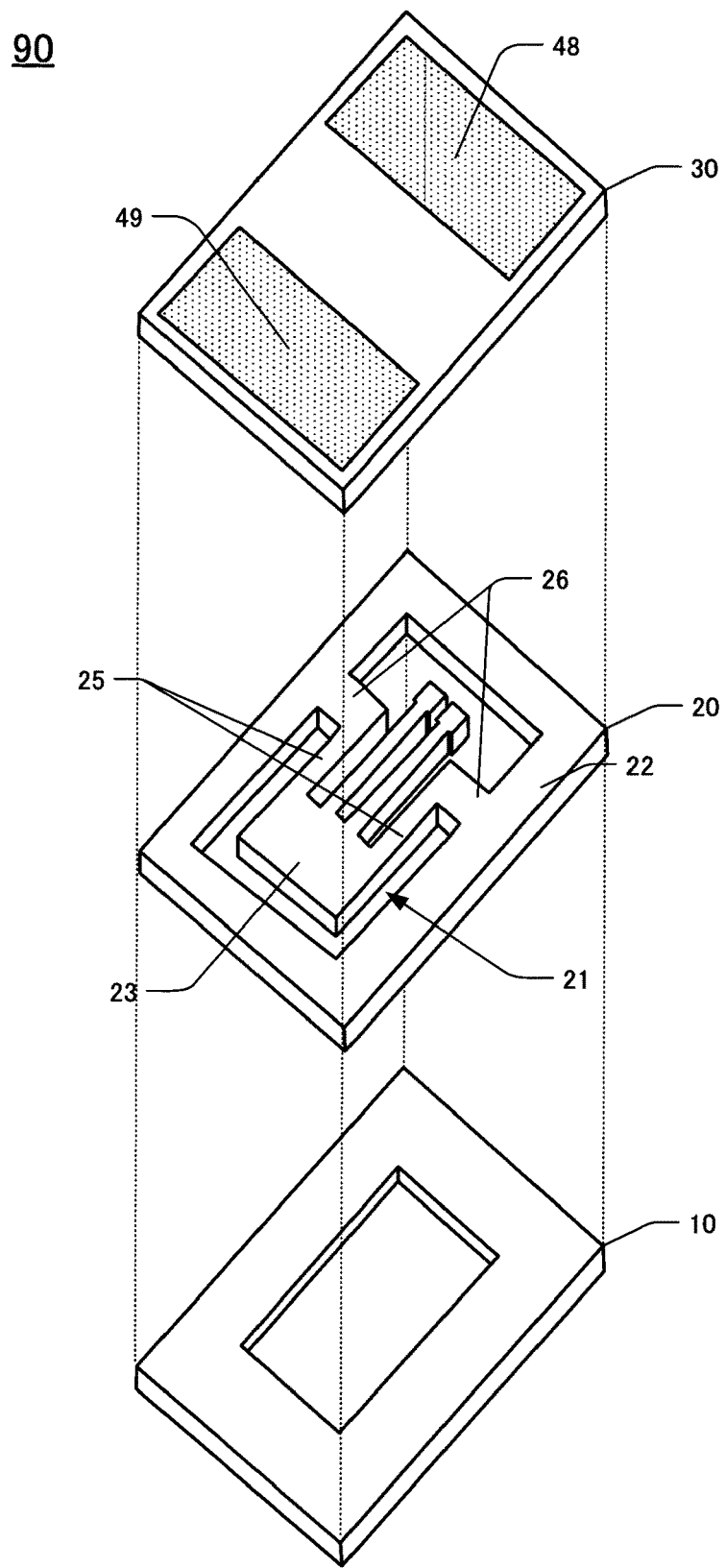
FIG. 1 is an exploded perspective view of a first embodiment of a piezoelectric device.

FIG. 1 is an exploded view of an embodiment of a surface-mount-type (SMD) piezoelectric device 90, with the undersurface of the package base 30 facing upward in the figure. The piezoelectric device 90 comprises three layers: a lid 10, a crystal frame 20, and a package base 30. The crystal frame 20 includes a tuning-fork type piezoelectric vibrating portion 21 having supporting arms 25. The supporting arms 25 are connected via connecting portions 26 to a frame portion 22. The crystal frame 20 also includes a vibrating portion 21, a frame portion 22, a base portion 23, vibrating arms 24, supporting arms 25, and connecting portions 26. All these structures on the crystal frame 20 are formed integrally. The piezoelectric device 90 will be explained further later below.

The crystal frame 20 is sandwiched between the lid 10 and the package base 30, and these components are bonded together. More specifically, the downward-facing surface of the frame portion 22 is bonded to the lid 10, and the upward-facing surface of the frame portion 22 is bonded to the package base 30. Thus, the base portion 23 need not be affixed to the package base 30 by adhesive. This configuration prevents significant frequency changes Δf that otherwise would occur upon affixing the vibrating portion 21 to the package base 30.

Configuration of Crystal Frame

Figure 2:
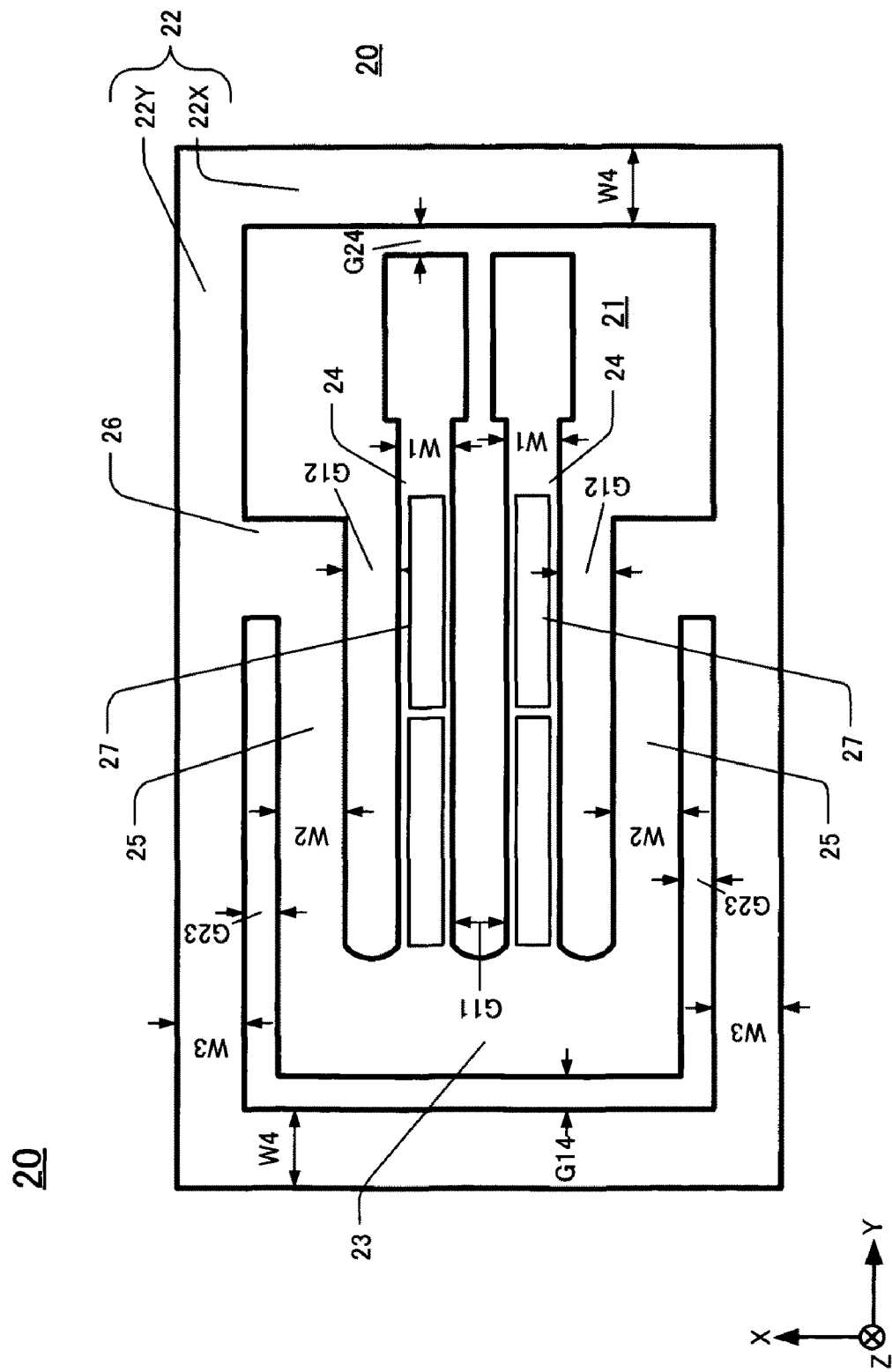
FIG. 2 is a plan view of the crystal frame of the first embodiment.

Referring now to FIG. 2, the crystal frame 20 comprises a tuning-fork type piezoelectric vibrating portion 21, a frame portion 22, and supporting arms 25. The crystal frame 20 is formed integrally with all these structures having the same thickness. The vibrating portion 21 comprises the base portion 23 and vibrating arms 24. The vibrating arms 24 include respective grooves 27. The frame portion 22 has first frame members 22Y extending in the length dimension (Y-axis direction) and second frame members 22X extending in the width dimension (X-axis direction). The length of the first frame members 22Y is greater than the length of the second frame members 22X. The first frame members 22Y are parallel to each other, and the second frame members 22X are parallel to each other. The frame members are connected to each other to form the frame portion 22 that surrounds the vibrating portion 21 and supporting arms 25. Each of the first frame members 22Y has a width (in the X-direction) denoted "W3," and each of the second frame members 22X has a width (in the Y-direction) denoted "W4."

The supporting arms 25 extend from the base portion 23 in the Y-axis direction. The vibrating portion 21 is connected, via connecting portions 26 that extend in the X-axis direction from distal ends of respective supporting arms 25, to the frame portion 22. For clarity of actually depicted detail, FIG. 2 does not show excitation electrodes and base electrodes; these electrodes will be explained later. The connecting portions 26 are also surrounded by the frame portion 22. The connecting portions 26 are connected to the frame portion 22. Adjustments of vibration-frequency can be performed by trimming the width of the connecting portions 26 which are formed sufficiently wide to accommodate trimming as required.

The crystal frame 20 is very small, producing an oscillating signal at 32.768 kHz, for example. The X-direction width of the crystal frame 20 is in the range of 0.7 mm to 2 mm, and the Y-direction length is in the range of 1.5 mm to 4 mm.

The pair of vibrating arms 24 extends in the Y-direction from the base portion 23. A respective groove 27 is formed on each of the upper and lower surfaces of each vibrating arm 24. For example, two respective grooves may be formed on each major surface of each vibrating arm, yielding a total of four grooves per vibrating arm 24. Two grooves per surface has the same effect as one groove per surface. A cross-section of a vibrating arm 24 having at least one groove 27 on each of the upper and lower surfaces has a substantially H-shaped transverse profile. The grooves advantageously reduce the CI value of the vibrating portion.

Each vibrating arm 24 has a distal end that is wider (in the X-direction) than most of the arm. This configuration is termed a "hammer-head shape." Each hammer-head includes a metal film that serves as a weight. The weights facilitate oscillation of the vibrating arms 24 easily whenever a voltage is applied to the vibrating arms 24. The weights also facilitate stable oscillation.

The supporting arms 25 extend from the base portion 23 in the X-direction and then extend in the Y-direction, outboard of the respective vibrating arms 24. The length of the supporting arms 25 in the Y-direction does not exceed the length of the vibrating arms 24. The supporting arms 25 reduce oscillation leakage from the vibrating arms 24 to the outside of the piezoelectric device 90 and also reduce adverse effects of external temperature changes or physical impacts on the device.

By appropriately adjusting the width W1 of the vibrating arms 24, the width W2 of the supporting arms 25, the width W3 of the first (Y-direction) frame members 22Y, and the width W4 of the second (X-direction) frame members 22X at the time the crystal frame 20 is fabricated, the frequency change Δf conventionally accompanying package-bonding of the lid 10 and package base 30 and/or device-mounting to a circuit board can be reduced significantly.

Figure 3:
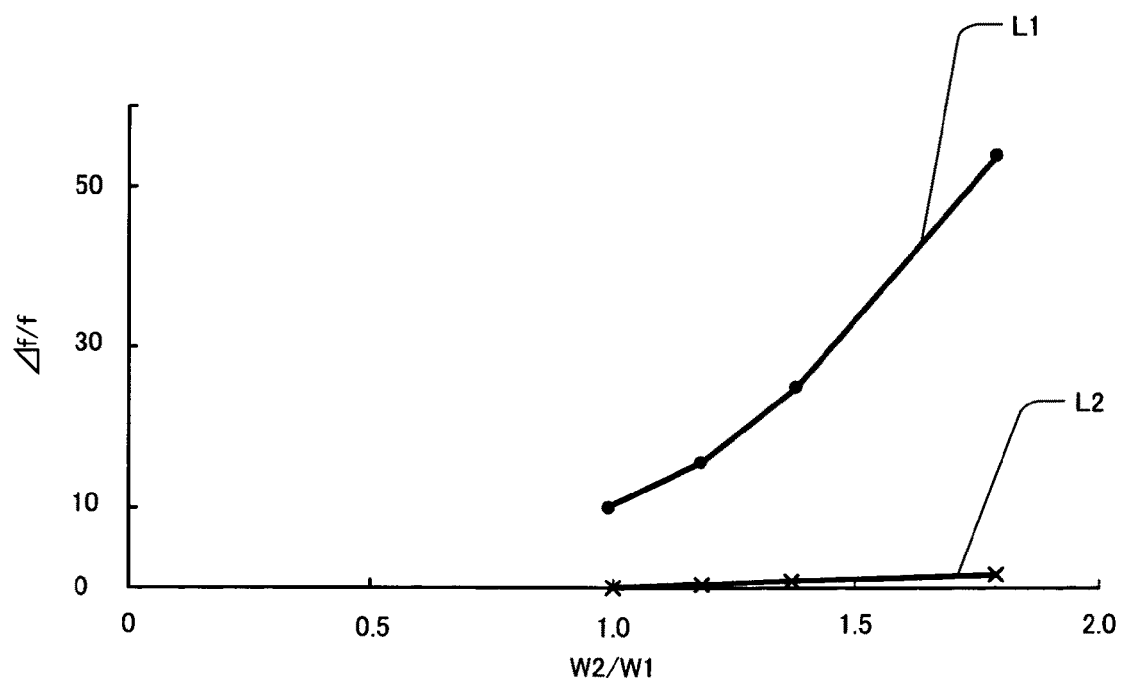
FIG. 3 is a graph of the frequency-change ratio (Δf/f) as a function of the width ratio W2/W1 for the first embodiment. W2/W1 is the width of a supporting arm divided by the width of a vibrating arm.

For configuring the crystal frame 20, the widths W1, W2, W3, W4 are selected as described below. These widths are important parameters. FIG. 3 is a graph of the rate of frequency change Δf/f as functions of the arm-width ratio W2/W1. The rate of frequency change Δf/f is a ratio of frequency change Δf to designated frequency f; the arm-width ratio W2/W1 is of the width W2 of the supporting arms 25 to the width W1 of the vibrating arms 24. For simulation, several values of the widths W1 and W2 were prepared, and Δf/f was measured based on changes in W2/W1.

Figure 4:
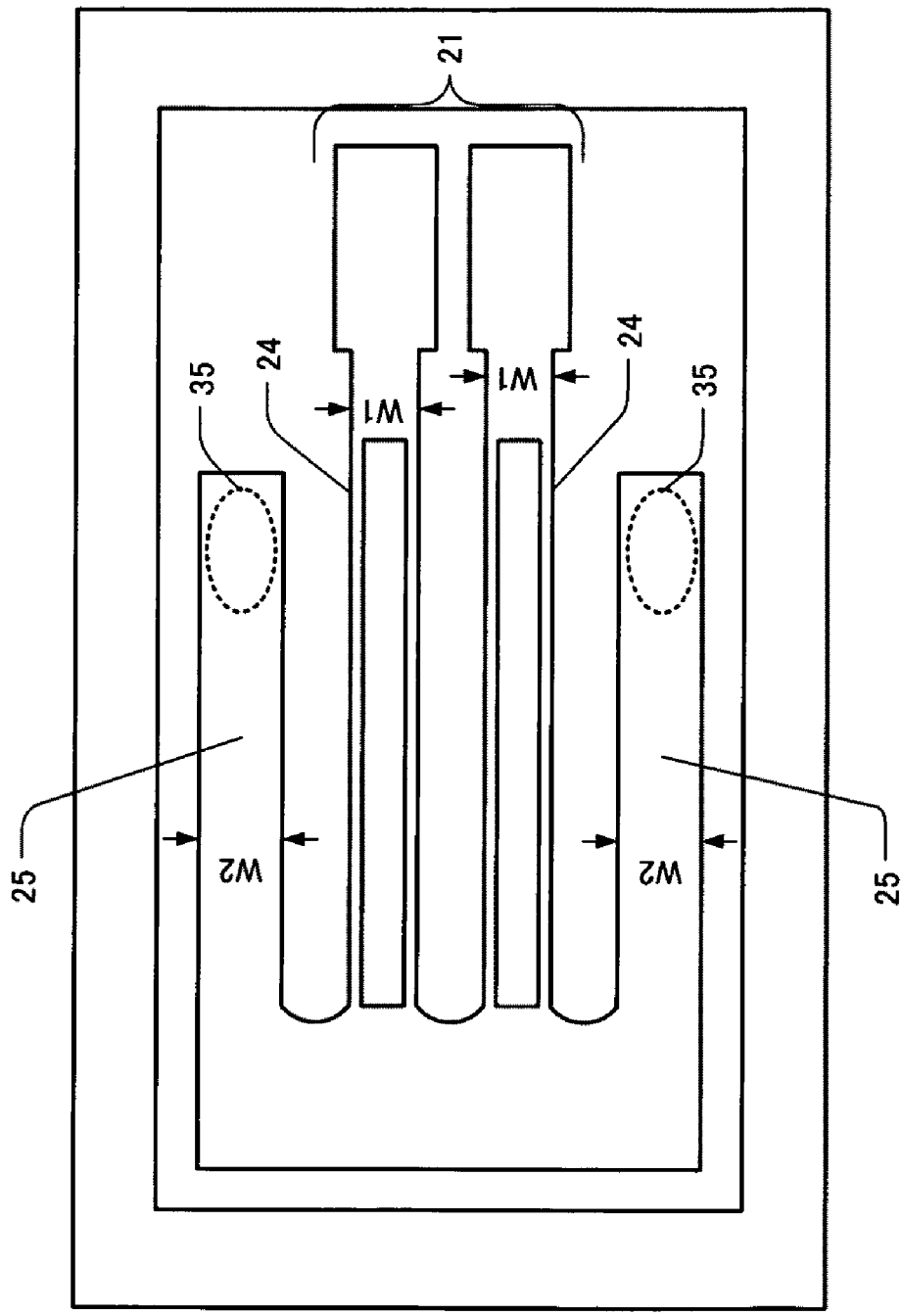
FIG. 4 is a plan view of a piezoelectric vibrating piece according to a second embodiment, including a vibrating portion connected to the frame portion by supporting arms. The piezoelectric vibrating piece is affixed to a package base by adhesive at the proximal ends of the supporting arms.

The line L1 in FIG. 3 denotes the rate of frequency change Δf/f exhibited by a piezoelectric vibrating device in which the vibrating portion 21 has supporting arms 25 that are affixed to the package base 30 by adhesive 35 applied to the distal ends of the supporting arms, as shown in FIG. 4. The line L2 denotes the rate of frequency change Δf/f exhibited by a piezoelectric vibrating device in which the vibrating portion is according to the embodiment as shown in FIG. 2.

As can be seen in FIG. 3, the rate of frequency change Δf/f is dramatically smaller whenever the vibrating portion 21 and connecting portions 26 are formed integrally and bonded into a package, in contrast to a vibrating portion 21 that is affixed onto a package base by adhesive 35 at the distal ends of the supporting arms 25. Also, by establishing the arm ratio W2/W1 to be less than or equal to 1.4, the rate of frequency change Δf/f of both devices can be substantially reduced.

Thus, according to Equation (1), whenever the width W2 of the supporting arms 25 is less than or equal to 1.4 times the width W1 of the vibrating arms 24, a substantially lower rate of frequency change Δf/f and a more stable vibrating performance are realized.

$$W2 \leq (1.4 \times W1) \quad (1)$$

Figure 5:
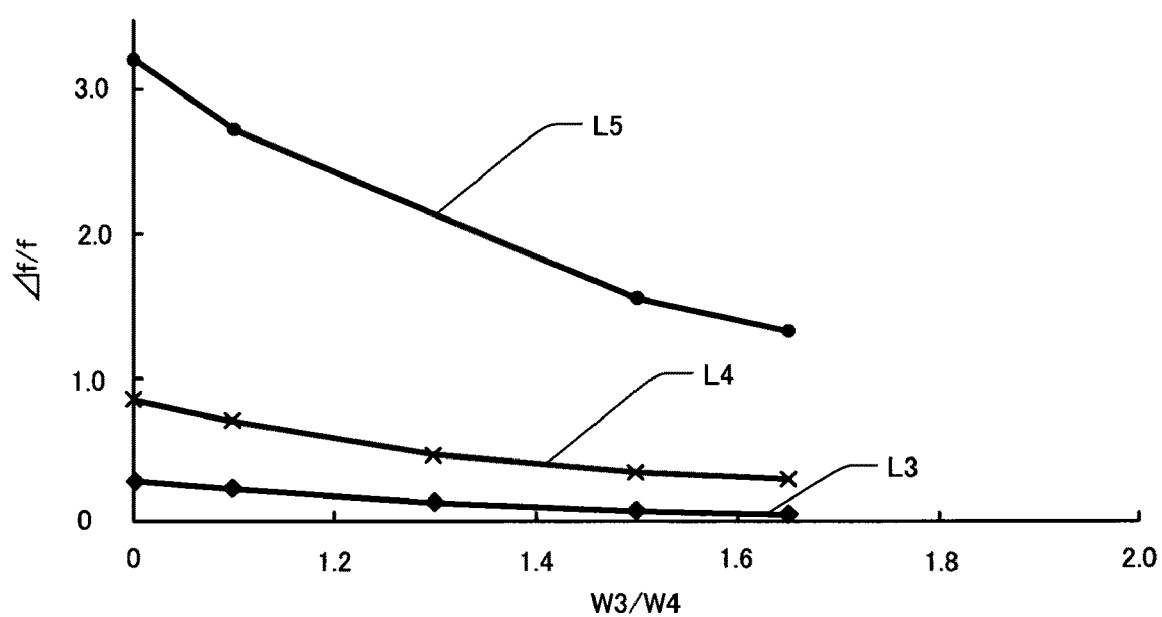
FIG. 5 is a graph of the frequency-change ratio (Δf/f) as a function of the width ratio W3/W4 for the second embodiment. W3/W4 is the width of a supporting arm divided by the width of a vibrating arm.

FIG. 5 is a graph of the rate of frequency change Δf/f a functions of the width ratios W3/W4, which is the ratio of the width W3 of the first frame members 22Y and the width W4 of the second frame members 22X. This graph shows simulation results. The line L3 denotes the rate of frequency change Δf/f for various frame-width ratios W3/W4 whenever the arm-width ratio W2/W1 is 1.18; the line L4 denotes values of Δf/f for various frame-width ratios W3/W4 whenever the arm-width ratio W2/W1 is 1.37; and the line L5 denotes values of Δf/f for various values of W3/W4 whenever W2/W1=1.78.

From the results shown in FIG. 5 as well as FIG. 3, if the arm-width ratio W2/W1 is small, the rate of frequency change Δf/f is also small. Also, even with changes in the frame-width ratio W3/W4, if the arm-width ratio W2/W1 is less than or equal to 1.4, then Δf/f is small. Further, if the frame-width ratio W3/W4 is at least 1.1, then Δf/f is small.

Therefore, according to FIG. 5, by establishing the width W3 of the first frame members 22Y to be at least 1.1 times the width W4 of the second frame member 22X, a piezoelectric vibrating device exhibiting a low Δf/f rate can be provided, as expressed in Equation (2):

$$W3 \geq (1.1 \times W4) \quad (2)$$

Note that the width W4 of the second frame member 22X should be no less than the arm-width W1 to provide sufficient bonding area for sealing the crystal frame 20 into a package. This is expressed in Equation (3). I.e., a piezoelectric device that is resistant to age-deterioration can be manufactured whenever the width W4 of the second frame member 22X is no greater than or equal to the width W1 of the vibrating arms 24.

$$W4 \geq (1.0 \times W1) \quad (3)$$

According to Equation (3), Equation (2) can be changed to Equation (4). I.e., if the width W1 of the vibrating arms 24 is determined, then the width W2 of the supporting arms 25, the width W3 of the first frame member 22Y, and the width W4 of the second frame member 22X also can be determined.

$$W3 \geq (1.1 \times W1) \quad (4)$$

The key widths of the crystal frame 20 can be found using the equations above. Next, certain spaces G (see FIG. 2) between main components of the crystal frame will be explained. The spaces G of the crystal frame 20 include the space G11 between the vibrating arms 24, the spaces G12 between each vibrating arm 24 and respective supporting arm 25, the spaces G23 between the supporting arms 25 and the respective Y-axis frame portion 22Y, the space G14 between the X-axis frame portion 22X and the base portion 23, and the space G24 between the X-axis frame portion 22 and the vibrating arm 24.

The space G11 is less than or equal to the width W1 of a vibrating arm 24, as expressed by Equation (5). Note that the minimum value of the space G11 is one in which the distal ends of the vibrating arms 24 do not touch each other.

$$G11 \leq W1 \quad (5)$$

As expressed in Equation (6), the space G12 is equal to the width W1 of a vibrating arm 24. Whenever G12=W1, etchant can flow fully around the vibrating arms 24 during etching. This provides the vibrating arms 24 with a precise outline profile during fabrication.

$$G12 = W1 \quad (6)$$

In response to relentless demands for miniaturizing the crystal frame 20, the spaces 23G, the space G14, and the space 24 are formed as narrow as possible by etching.

As explained above, by determining the width W1 of the vibrating arms 24, other widths W and spaces G can be determined that are the main components of the crystal frame 20. Hence, piezoelectric vibrating devices can be manufactured that exhibit only small rates of frequency change Δf/f when the crystal frame 20 is being packaged or when the crystal frame 20 is being mounted on a circuit board, and that are reliable.

The frame portion 22, the supporting arms 25, the outline profile of the vibrating portion 21, and the grooves 27 can be formed using known photoresist-etching techniques. The excitation electrodes and other electrodes are formed by a photoresist-etching technique on the crystal frame 20 where the outline profile and grooves have been formed.

Configuration of Electrodes

FIG. 6 shows an exemplary configuration of electrodes on the crystal frame 20. A first base electrode 41 and second base electrode 42 are formed on the upper surfaces of the frame portion 22, the base portion 23, the supporting arms 25, and the connecting portions 26 of the crystal frame 20. Similar electrodes are formed on the corresponding lower surfaces of the crystal frame 20 in the same manner.

A first excitation electrode 43 and a second excitation electrode 44 are formed on the upper, lower, and side surfaces of each vibrating arm 24. As shown in FIG. 6, the electrodes formed on the respective vibrating arms 24 are different from one another by plus and minus. The first excitation electrode 43 is connected to the first base electrode 41, and the second excitation electrode 44 is connected to the second base electrode 42, respectively. By applying a voltage on the first base electrode 41 and the second base electrode 42, the vibrating arms 24, surrounded by the first excitation electrode 43 and the second excitation electrode 44, are oscillated.

Simultaneously with forming the electrodes, a metal film 40 is formed on the hammer-head portions of the vibrating arms 24. The metal film 40 acts as respective weights that can be trimmed as required to reduce the mass of metal in the film and correspondingly alter the vibration frequency of the vibrating arms.

The distal ends of the vibrating arms 24 of this embodiment have hammer-heads that are abruptly wider at the proximal edge of each hammer-head. Alternatively, the hammer-heads can have a more fan-like profile, obtained by changing the width gradually over the length of the hammer-head. In any event, it is important that fan-shaped heads do not touch each other.

First Embodiment of Piezoelectric Device

A first embodiment of a piezoelectric device 100 is shown in FIGS. 7A-7D. A "piezoelectric device" is simply a piezoelectric vibrating piece contained in a package that generally comprises a lid 10 and a package base 30. In this embodiment, the crystal frame 20 forms a portion of the package along with a lid 11 and a package base 31.

Figure 7A:
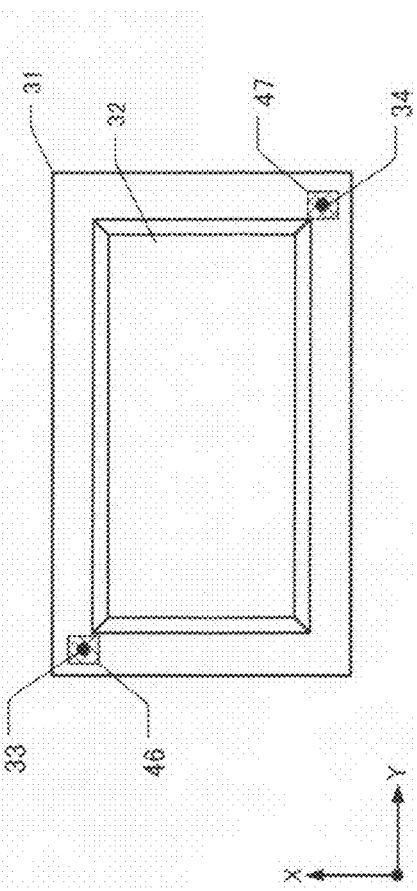
FIG. 7A is a plan view of the inner major surface of a package lid of the first embodiment of a piezoelectric device.
Figure 7B:
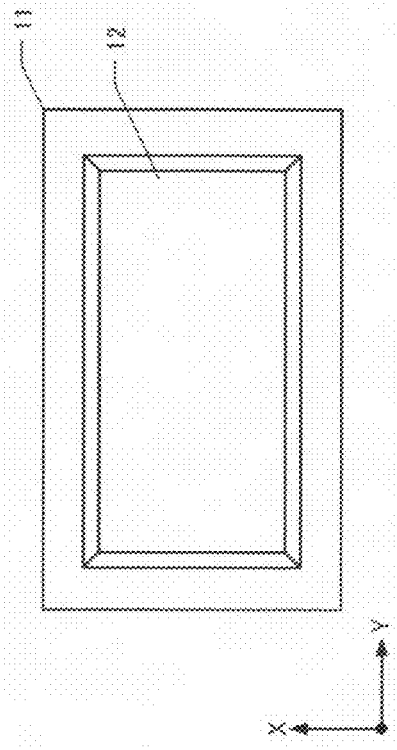
FIG. 7B is a plan view of the crystal frame of the first embodiment of a piezoelectric device.
Figure 7C:
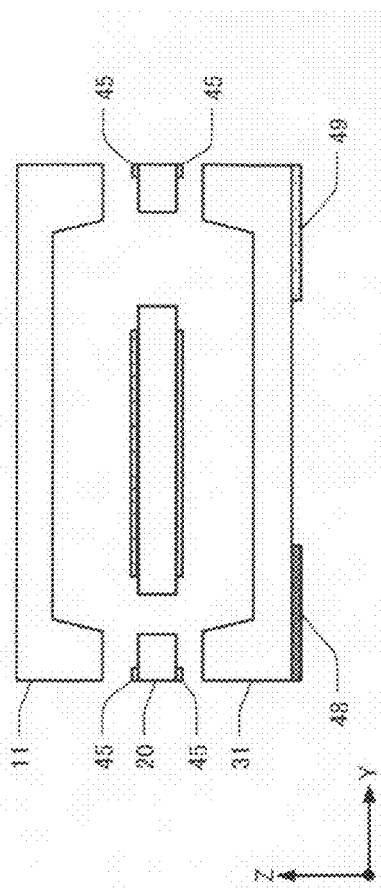
FIG. 7C is a plan view of the inner major surface of a package base of the first embodiment of a piezoelectric device.
Figure 7D:
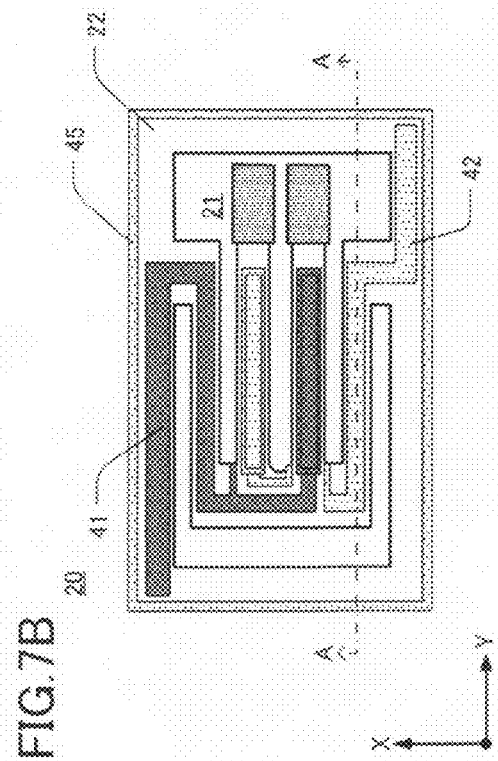
FIG. 7D is an elevational section of the first embodiment of a piezoelectric device.

FIG. 7A is a plan view of the inner major surface of the lid 11, FIG. 7B is a plan view of the upper major surface of the crystal frame 20, and FIG. 7C is a plan view of the inner view of the inner major surface of the package base 31. FIG. 7D is an elevational section of this embodiment 100.

To form the package, the package base 31 is aligned with and bonded to the lower major surface of the frame portion 22, and the lid 11 is aligned with and bonded to the upper surface of the frame portion 22. Thus, the crystal frame 20 is sandwiched between the lid 11 and package base 31 to form the piezoelectric device 100.

The lid 11 and package base 31 desirably are made of glass. As shown in FIG. 7A, the lid 11 has a concavity 12 on its inner major surface that faces the crystal frame 20 in the piezoelectric device 100. FIG. 7B depicts the crystal frame 20 of which a peripheral region 45 includes a metal film 45. More specifically, the metal film 45 is formed on the peripheral regions of the upper major surface, on the peripheral regions of the lower major surface, and on edge surfaces of the frame portion 22. The metal film 45 can be formed by sputtering or vacuum deposition. Desirably, the metal film 45 comprises aluminum (Al) with a thickness of 1000 to 1500 Ångstroms.

In FIG. 7C, the package base 31 includes a concavity 32 on the inner major surface facing the crystal frame 20. The package base 31 desirably is made of glass, wherein the concavity 32 is formed by etching. Etching also forms a first through-hole 33 and a second through-hole 34. At the through-holes 33, 34, first and second connecting electrodes 46, 47, respectively, are formed in respective corners of the inner major surface. The internal surfaces of the first and second through-holes 33, 34 are coated with a metal film, which can be formed in a photolithography step performed at the time of forming the first and second connecting electrode 46, 47. The metal film in the through-holes 33, 34 desirably is a gold (Au) layer or silver (Ag) layer. The package base 31 also includes a first external electrode 48 and a second external electrode 49 metalized on the lower major surface of the package base. The first connecting electrode 46 is connected to the first external electrode 48 via the first through-hole 33. Similarly, the second connecting electrode 47 is connected to the second external electrode 49 via the second through-hole 34.

First and second base electrodes 41, 42, formed on the lower major surface of the frame portion 22, are connected to the first and second connecting electrodes 46, 47, respectively, formed on the upper major surface of the package base 31. Hence, the first base electrode 41 is electrically connected to the first external electrode 48, and the second base electrode 42 is electrically connected to the second external electrode 49.

As shown in FIG. 7D, the lid, frame, and package base of FIGS. 7A, 7B, and 7C, respectively, are layered and bonded together by anodic bonding to form this embodiment of a piezoelectric device 100. The lid 11 and package base 31 desirably are made of Pyrex® glass, borosilicate glass, sodium glass, or other glass material including metal ions such as sodium ions. As noted, the periphery of the upper and lower surfaces of the frame portion 22 includes a connecting metal film 45, desirably made of aluminum. In the package the crystal frame 20 (including the tuning-fork type piezoelectric vibrating portion 21) is sandwiched between the lid 11 (having the concavity 12) and the package base 31 (having the concavity 32). Alternatively to aluminum, the connecting metal film 45 can be a gold layer formed on a chromium layer.

Anodic bonding is performed by impressing heat and voltage on the bonding interfaces to induce a chemical reaction in which the metal on the bonding interfaces is oxidized. For anodic bonding of the frame portion 22, the lid 11, and the package base 31, the metal film formed in the peripheral regions of each of the upper and lower surfaces of the frame portion 22 is bonded to the bonding surface of the glass material.

To perform anodic bonding, the metal film is connected as an anode, and a cathode is arranged on a bonding surface of the glass material facing the metal film. An electric potential is applied between the anode and cathode, which causes the metal ions (e.g., sodium) in the glass to migrate to the cathode. This migration causes oxidation of the metal film at the bonding interfaces, which bonds the materials together. By way of example, in this embodiment, the metal and glass are bonded together by applying a potential of 500 V to 1 kV between the anode and cathode at a temperature of 200 to 400° C.

The vibration frequency of the piezoelectric device 110 is adjusted during manufacturing. In a vacuum or inactive gas environment, the base 31 and the frame portion 22 are bonded together by anodic bonding. Frequency adjustment is then performed. Then, the lid 11 is bonded to the frame portion 22 (which had been previously bonded to the package base 31) and vibration frequency is measured and adjusted in a vacuum state or inactive gas environment. Then, the first and second through-holes 33, 34 are filled with a metallic material, thereby completing manufacture of the piezoelectric device 100.

FIG. 7D shows the frame portion 22, the lid 11, and the package base 31 being bonded together to form a single unitary device. In an actual process for manufacturing multiple piezoelectric devices, hundreds to thousands of crystal frames 20 are formed on a single quartz-crystal wafer. A corresponding number and arrangement of lids 11 are formed on a first glass wafer, and a corresponding number and arrangement of package bases 31 are formed on a second glass wafer. The three wafers are sandwiched and bonded to form hundreds to thousands of piezoelectric devices simultaneously.

Second Embodiment of Piezoelectric Device

This embodiment 110 is depicted in FIGS. 8A-8D, and generally comprises a crystal frame 20, a lid 10 and a package base 30, all desirably made from respective crystal substrates. FIGS. 8A-8D provide respective schematic views. More specifically, FIG. 8A is a plan view of the inner major surface of the second lid 111; FIG. 8B is a top plan view of the crystal frame 20, and FIG. 8C is a plan view of one of the major surfaces of the package base 131. FIG. 8D is an elevational section of the second embodiment.

Generally, the second embodiment 110 comprises three layers made of crystal substrate. Since the electrodes, the through-holes, and the general shapes of component parts of this embodiment are similar to corresponding parts of the first embodiment, only differences are explained below. Components that are similar to each other have similar reference numbers as corresponding components in the first embodiment.

In this embodiment 110 the lid 111 and package base 131 thereof are bonded to respective peripheral regions of the crystal frame 20 without having to use a connecting metal film 45. Omitting the connecting metal film 45 is possible because the second lid 111, the frame portion 22, and the package base 131 are bonded together by a siloxane (Si—O—Si) bonding technique rather than anodic bonding.

The vibration frequency of the second embodiment 110 can be adjusted during its manufacture. In a vacuum or inert-gas environment, the package base 131 and frame portion 22 are bonded together by siloxane-bonding method. Then, the lid 111 is bonded to the frame portion 22 that has previously been bonded to the base 131. Vibration frequency desirably is adjusted in a vacuum inert-gas environment. Completion of manufacture follows sealing the first and second through-holes 33 and 34, with a metal material. Siloxane bonding can be performed by, for example, heating and pressurizing the respective device in a high-temperature furnace heated to 100° C. to 450° C. after the bonding surfaces of the frame portion 22, the base 131, and the 111 are cleaned.

The bonding surfaces for siloxane bonding must be mirror-finished to avoid electrode thicknesses of 3000 to 4000 Å that result in imperfect contacts. Hence, the lower major surface of the frame portion 22 facing the first and second base electrodes 41, 42 desirably has a concavity of sufficient depth to accommodate the thickness of the connecting electrodes. Similarly, the upper surface of the package base 131 facing the first and second connecting electrodes 46, 47 desirably has a concavity of sufficient depth to accommodate the thickness of the connecting electrodes. Bonding surfaces formed in this manner, with concavities facing respective electrodes, do not inhibit siloxane bonding.

FIG. 8D is an elevational section of the frame portions 22, the lid 111, and the package base 131 being bonded together as a single unitary device. In an actual manufacturing process, hundreds to thousands of crystal frames 20 are formed on a single-crystal wafer. A corresponding number and arrangement of package lids 111 are formed on a first glass wafer, and a corresponding number and arrangement of package bases 131 are formed on a second glass wafer. The three wafers are stacked, with the single-crystal wafer being sandwiched between the glass wafers, and bonded together to form hundreds to thousands of piezoelectric devices simultaneously.

Representative embodiments are described above. It will be understood that these embodiments can be modified or changed while not departing from the spirit and scope of them and/or of the appended claims. In an exemplary modification, lithium niobate or a piezoelectric material other than quartz crystal can be used for the crystal frame 20 including a tuning-fork type crystal vibrating piece 21.

What is claimed is:

1. A piezoelectric frame, comprising:
a tuning-fork type piezoelectric vibrating portion including a base portion, a pair of vibrating arms extending in a first direction from the base portion, and an excitation electrode formed on the vibrating arms, each vibrating arm having a first width (W1);
outboard of each vibrating arm, a respective supporting arm extending from the base portion in the first direction, each supporting arm having a second width (W2);
a respective connecting arm extending from each supporting arm in a second direction that crosses the first direction; and
an outer frame portion connected to the connecting arms and surrounding the tuning-fork type piezoelectric vibrating piece, supporting arms, and connecting arms, the outer frame portion including first side members extending parallel to each other in the first direction and second side members extending parallel to each other in the second direction and being coupled to the first side members to form the outer frame portion, the first side members having a third width (W3) and the second side members having a fourth width (W4), wherein $W2 \leq (1.4 \times W1)$.

2. The piezoelectric frame of claim 1, wherein $W3 \geq (1.1 \times W1)$.

3. A piezoelectric device, comprising;
a piezoelectric frame as recited in claim 2;
a lid covering the piezoelectric frame; and
a package base supporting the piezoelectric frame.

4. The piezoelectric device of claim 3, wherein:
the lid and package base are made of a material comprising glass containing metal ions;
the first side members and second side members each comprise a surficial metal film on respective surfaces thereof facing the lid and package base; and
the lid and package base are bonded to the metal films as a result of anodic bonding.

5. The piezoelectric device of claim 3, wherein:
the lid and base are each made of a piezoelectric material; and
the outer frame portion is bonded to the lid and to the package base as a result of siloxane bonding.

6. A piezoelectric device, comprising;
a piezoelectric frame as recited in claim 1;
a lid covering the piezoelectric frame; and
a package base supporting the piezoelectric frame.

7. The piezoelectric device of claim 6, wherein:
the lid and package base are made of a material comprising glass containing metal ions;
the first side members and second side members each comprise a surficial metal film on respective surfaces thereof facing the lid and package base; and
the lid and package base are bonded to the metal films as a result of anodic bonding.

8. The piezoelectric device of claim 6, wherein:
the lid and base are each made of a piezoelectric material; and
the outer frame portion is bonded to the lid and to the package base as a result of siloxane bonding.

9. A piezoelectric frame, comprising:
a tuning-fork type piezoelectric vibrating portion including a base portion, a pair of vibrating arms extending in a first direction from the base portion, and an excitation electrode formed on the vibrating arms, each vibrating arm having a first width (W1);
outboard of each vibrating arm, a respective supporting arm extending from the base portion in the first direction, each supporting arm having a second width (W2);
a respective connecting arm extending from each supporting arm in a second direction that crosses the first direction; and an outer frame portion connected to the connecting arms and surrounding the tuning-fork type piezoelectric vibrating piece, supporting arms, and connecting arms, the outer frame portion including first side members extending parallel to each other in the first direction and second side members extending parallel to each other in the second direction and being coupled to the first side members to form the outer frame portion, the first side members having a third width (W3) and the second side members having a fourth width (W4), wherein $W3 \geq (1.1 \times W4)$.

10. The piezoelectric frame of claim 9, wherein $W4 \geq W1$.

11. A piezoelectric device comprising;
a piezoelectric frame as recited in claim 10;
a lid covering the piezoelectric frame; and
a package base supporting the piezoelectric frame.

12. The piezoelectric device of claim 11, wherein:
the lid and package base are made of a material comprising glass containing metal ions;
the first side members and second side members each comprise a surficial metal film on respective surfaces thereof facing the lid and package base; and
the lid and package base are bonded to the metal films as a result of anodic bonding.

13. The piezoelectric frame of claim 9, wherein $W2 \leq (1.4 \times W1)$.

14. A piezoelectric device, comprising:
a piezoelectric frame as recited in claim 13;
a lid covering the piezoelectric frame; and
a package base supporting the piezoelectric frame.

15. The piezoelectric device of claim 9, wherein $W2 \leq (1.4 \times W1)$.

16. A piezoelectric device, comprising;
a piezoelectric frame as recited in claim 15;
a lid covering the piezoelectric frame; and
a package base supporting the piezoelectric frame.

17. The piezoelectric device of claim 16, wherein:
the lid and package base are made of a material comprising glass containing metal ions;
the first side members and second side members each comprise a surficial metal film on respective surfaces thereof facing the lid and package base; and
the lid and package base are bonded to the metal films as a result of anodic bonding.

18. A piezoelectric device, comprising;
a piezoelectric frame as recited in claim 9;
a lid covering the piezoelectric frame; and
a package base supporting the piezoelectric frame.

19. The piezoelectric device of claim 18, wherein:
the lid and package base are made of a material comprising glass containing metal ions;
the first side members and second side members each comprise a surficial metal film on respective surfaces thereof facing the lid and package base; and
the lid and package base are bonded to the metal films as a result of anodic bonding.

20. The piezoelectric device of claim 18, wherein:
the lid and base are each made of a piezoelectric material; and
the outer frame portion is bonded to the lid and to the package base as a result of siloxane bonding.

* * * * *